US008970456B2

(12) United States Patent
Lhee et al.

(10) Patent No.: US 8,970,456 B2
(45) Date of Patent: Mar. 3, 2015

(54) ORGANIC LIGHT EMITTING DIODE DISPLAY

(75) Inventors: Zail Lhee, Yongin (KR); Ji-Yeon Baek, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 492 days.

(21) Appl. No.: 13/064,681

(22) Filed: Apr. 8, 2011

(65) Prior Publication Data

US 2012/0056904 A1 Mar. 8, 2012

(30) Foreign Application Priority Data

Sep. 7, 2010 (KR) .......................... 10-2010-0087597

(51) Int. Cl.
*G09G 3/30* (2006.01)
*G09G 3/32* (2006.01)
*H01L 27/32* (2006.01)

(52) U.S. Cl.
CPC .......... *G09G 3/3233* (2013.01); *H01L 27/3211* (2013.01); *H01L 27/3276* (2013.01); *G09G 2300/0426* (2013.01); *H01L 2251/558* (2013.01)
USPC ........................................... 345/76; 345/211

(58) Field of Classification Search
CPC ............... H01L 27/3276; H01L 33/62; G09G 3/3208–3/3291
USPC ................... 257/E51.022; 315/169.1–169.3; 345/76–83, 204–215
See application file for complete search history.

(56) References Cited

U.S. PATENT DOCUMENTS

| 7,067,985 | B2 * | 6/2006 | Adachi .................... 315/169.3 |
|---|---|---|---|
| 7,336,036 | B2 * | 2/2008 | Furuie et al. ............... 315/169.3 |
| 7,336,272 | B2 * | 2/2008 | Okamoto .................... 345/211 |
| 7,839,079 | B2 * | 11/2010 | Choi et al. .................... 313/504 |
| 2003/0168965 | A1 * | 9/2003 | Kijima et al. ................ 313/495 |
| 2004/0012058 | A1 * | 1/2004 | Aoki ............................. 257/414 |
| 2004/0189553 | A1 * | 9/2004 | Kabuto et al. ............... 345/75.2 |
| 2006/0284803 | A1 * | 12/2006 | Ikeda ............................. 345/76 |
| 2007/0194706 | A1 * | 8/2007 | Jung et al. .................... 313/506 |
| 2008/0001875 | A1 * | 1/2008 | Yuuki et al. .................... 345/87 |
| 2010/0277449 | A1 * | 11/2010 | Kanda ........................... 345/206 |
| 2011/0267327 | A1 * | 11/2011 | Hwang ......................... 345/211 |
| 2012/0007496 | A1 * | 1/2012 | Maruyama et al. .......... 313/504 |

FOREIGN PATENT DOCUMENTS

| JP | 2002-151276 | 5/2002 |
|---|---|---|
| JP | 2003-107503 | 4/2003 |
| JP | 2008-010744 | 1/2008 |

* cited by examiner

*Primary Examiner* — Alexander Eisen
*Assistant Examiner* — Sanjiv D Patel
(74) *Attorney, Agent, or Firm* — Lee & Morse, P.C.

(57) ABSTRACT

An OLED display having a first pixel, a second pixel, and a third pixel arranged in a matrix format including: a substrate; gate lines formed on the substrate; data lines crossing the gate lines in the insulated manner; a plurality of driving power lines formed on the substrate and including a first driving power line transmitting a driving voltage to the first pixel, second driving power line transmitting a driving voltage to the second pixel, and a third driving power line transmitting a driving voltage to the third pixel; a switching thin film transistor connected with the gate lines and the data lines; a driving transistor connected with the switching thin film transistor and the driving power lines; a first electrode connected with the driving transistor; an organic light emitting member formed on the first electrode; and a second electrode formed on the organic light emitting member.

12 Claims, 8 Drawing Sheets

| R | G | B | R | G | B | R | G | B |
|---|---|---|---|---|---|---|---|---|
| R | G | B | R | G | B | R | G | B |
| R | G | B | R | G | B | R | G | B |

FIG.8

ORGANIC LIGHT EMITTING DIODE DISPLAY

BACKGROUND

1. Field

The described technology relates generally to an organic light emitting diode (OLED) display.

2. Description of the Related Art

An organic light emitting diode (OLED) display includes two electrodes and an organic light emitting member disposed therebetween, and holes injected from one electrode and electrons injected from the other electrode are combined in the organic layer to form excitons and as the excitons generate energy such that light is emitted.

A plurality of driving power lines of the OLED display are sequentially connected to a plurality of pixels and sequentially transmit a driving voltage to the corresponding pixel. As the OLED display is increased in size, luminance of a pixel disposed at a center of the display is further deteriorated than the luminance of pixels disposed at upper and lower portions of the display. This deterioration is due to a voltage drop of a driving voltage supplied through upper and lower driving power lines.

Particularly, an organic light emitting member for a red color, an organic light emitting member for a green color, and an organic light emitting member for a blue color respectively consumes different amounts of current. Therefore, the degree of voltage drop occurring at each of a driving power line for the red color, a driving power line for the green color, and a driving power line for the blue light is different from each other. Thus, for realization of a white color, color coordinates of red, green, and blue pixels in the same row are changed with differences from each other due to the voltage drop of the driving power line. Therefore, a coordinate of a white color, that is, the sum of the coordinates of the red, green, and blue pixels is changed.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to an organic light emitting diode display, which substantially overcome one or more of the problems due to the limitations and disadvantages of the related art.

It is therefore a feature of an embodiment to provide an organic light emitting diode display with voltage drop values of driving voltages respectively applied to first, second, and third pixels in the same row are equivalent to each other.

It is therefore another feature of an embodiment to provide an organic light emitting diode display that prevents a coordinate of a white color from being changed.

At least one of the above and other features and advantages may be realized by providing an OLED display having a first pixel, a second pixel, and a third pixel arranged in a matrix format according to an exemplary embodiment including: a substrate; gate lines formed on the substrate; data lines crossing the gate lines in the insulated manner; a plurality of driving power lines formed on the substrate and including a first driving power line transmitting a driving voltage to the first pixel, second driving power line transmitting a driving voltage to the second pixel, and a third driving power line transmitting a driving voltage to the third pixel; a switching thin film transistor connected with the gate lines and the data lines; a driving transistor connected with the switching thin film transistor and the driving power lines; a first electrode connected with the driving transistor; an organic light emitting member formed on the first electrode; and a second electrode formed on the organic light emitting member. A cross-sectional area of the first driving power line, a cross-sectional area of the second driving power line, and a cross-sectional area of the third driving power line may be respectively proportional to a consumed current of the first pixel, a consumed current of the second pixel, and a consumed current of the third pixel.

The first pixel, the second pixel, and the third pixel may be respectively a red pixel, a green pixel, and a blue pixel.

At least one of the above and other features and advantages may also be realized by providing the cross-sectional area of the driving power line may be a product of multiplication of a line width and the thickness of the driving power line, and when the first driving power line, the second driving power line, and the third driving power line are the same in thickness, the line width of the first driving power line, the line width of the second driving power line, and the line width of the third driving power line may be respectively proportional to the a consumed current of the first pixel, a consumed current of the second pixel, and a consumed current of the third pixel.

The line width of the third driving power line may be greater than the line width of the first driving power line and the line width of the second driving power line.

Resistance of the third driving power line may be lower than resistance of the first driving power line and resistance of the second driving power line.

When resistance of the first driving power line is Rr, resistance of the second driving power line is Rg, and resistance of the third driving power line is Rb, Rr:Rg:Rb=1/1.3 to 1/2:1: 1/2.3 to 1/3 may be satisfied.

The first driving power line, the second driving power line, and the third driving power line may respectively have the same voltage drop value.

Voltage drop values of driving voltages respectively applied to first, second, and third pixels in the same row may be equivalent to each other.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0087597, filed on Sep. 7, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

In addition, the size and thickness of each component shown in the drawings are arbitrarily shown for understanding and ease of description, but embodiments are not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

An organic light emitting diode (OLED) display according to an exemplary embodiment will be described in further detail with reference to FIG. 1.

Figure 1:
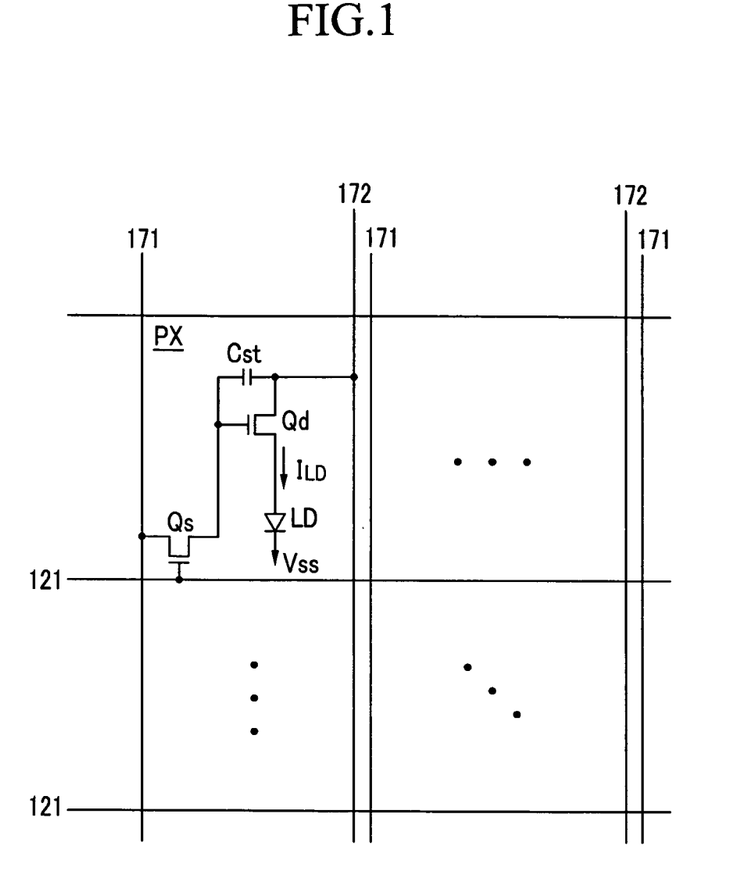
FIG. 1 illustrates an equivalent circuit of an organic light emitting diode (OLED) display according to an exemplary embodiment.

FIG. 1 is an equivalent circuit diagram of an OLED display according to the exemplary embodiment. Referring to FIG. 1, the OLED display according to the present exemplary embodiment includes a plurality of signal lines 121, 171, and 172 and a plurality of pixels PX respectively connected to the signal lines and substantially arranged in a matrix format.

The signal lines include a plurality of gate lines 121 transmitting a gate signal (or, scan signal), a plurality of data lines 171 transmitting a data signal, and a plurality of driving power lines 172 transmitting a driving voltage. The gate lines 121 substantially extend in a row direction and are substantially parallel with each other. The data lines 171 and the driving power lines 172 substantially extend in a column direction and are substantially parallel with each other.

Each pixel PX includes a switching thin film transistor Qs, a driving thin film transistor Qd, a storage capacitor Cst, and an organic light emitting diode (OLED) LD.

The switching thin film transistor Qs has a control terminal, an input terminal, and an output terminal. The control terminal is connected to the gate line 121, the input terminal is connected to the data line 171, and the output terminal is connected to the driving thin film transistor Qd. The switching thin film transistor Qs transmits the data signal applied to the data lines 171 to the driving thin film transistor Qd in response to the scan signal applied to the gate line 121.

The driving thin film transistor Qd also has a control terminal, an input terminal, and an output terminal. The control terminal is connected to the switching thin film transistor Qs, the input terminal is connected to a driving power line 172, and the output terminal is connected to the organic light emitting diode (OLED) LD. The driving thin film transistor Qd allows an output current ILD of which magnitude varies depending on a voltage between the control terminal and the output terminal to flow.

The capacitor Cst is connected between the control terminal and the input terminal of the driving thin film transistor Qd. The capacitor Cst charges the data signal applied to the control signal of the driving thin film transistor Qd and maintains the charging of the data signal after the switching thin film transistor Qs is turned off.

The organic light emitting diode (OLED) LD includes an anode connected to the output terminal of the driving thin film transistor Qd and a cathode connected to a common voltage Vss of the anode. The organic light emitting diode (OLED) LD emits light by changing the intensity according to the output current ILD of the driving thin film transistor Qd to display an image.

The switching thin film transistor Qs and the driving thin film transistor Qd are n-channel field effect transistors (FETs). However, at least one of the switching thin film transistor Qs and the driving thin film transistor Qd may be a p-channel FET. In addition, connection between the thin film transistors Qs and Qd and connection between the capacitor Cst and the organic light emitting diode (OLED) LD may be changed.

A detailed structure of the OLED display of FIG. 1 will be described with reference to FIG. 1 and FIG. 2 to FIG. 5.

Figure 2:
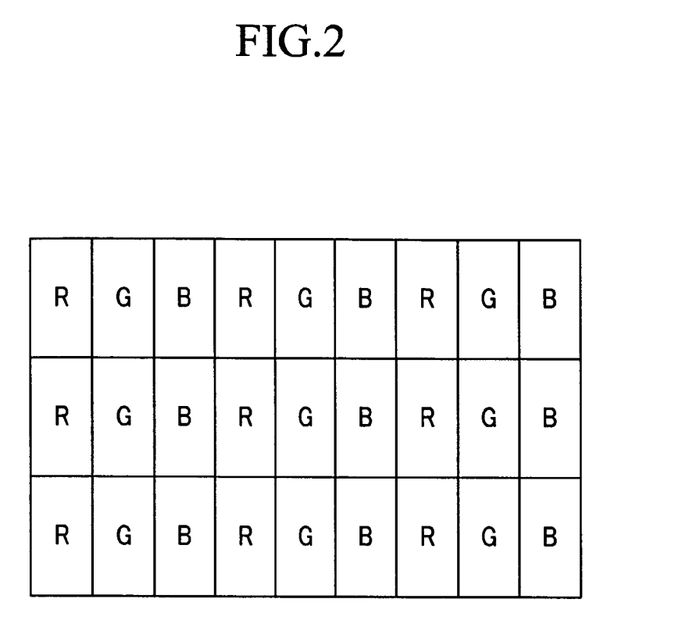
FIG. 2 illustrates a schematic diagram of arrangement of a plurality of pixels in the OLED display according to the exemplary embodiment.
Figure 3:
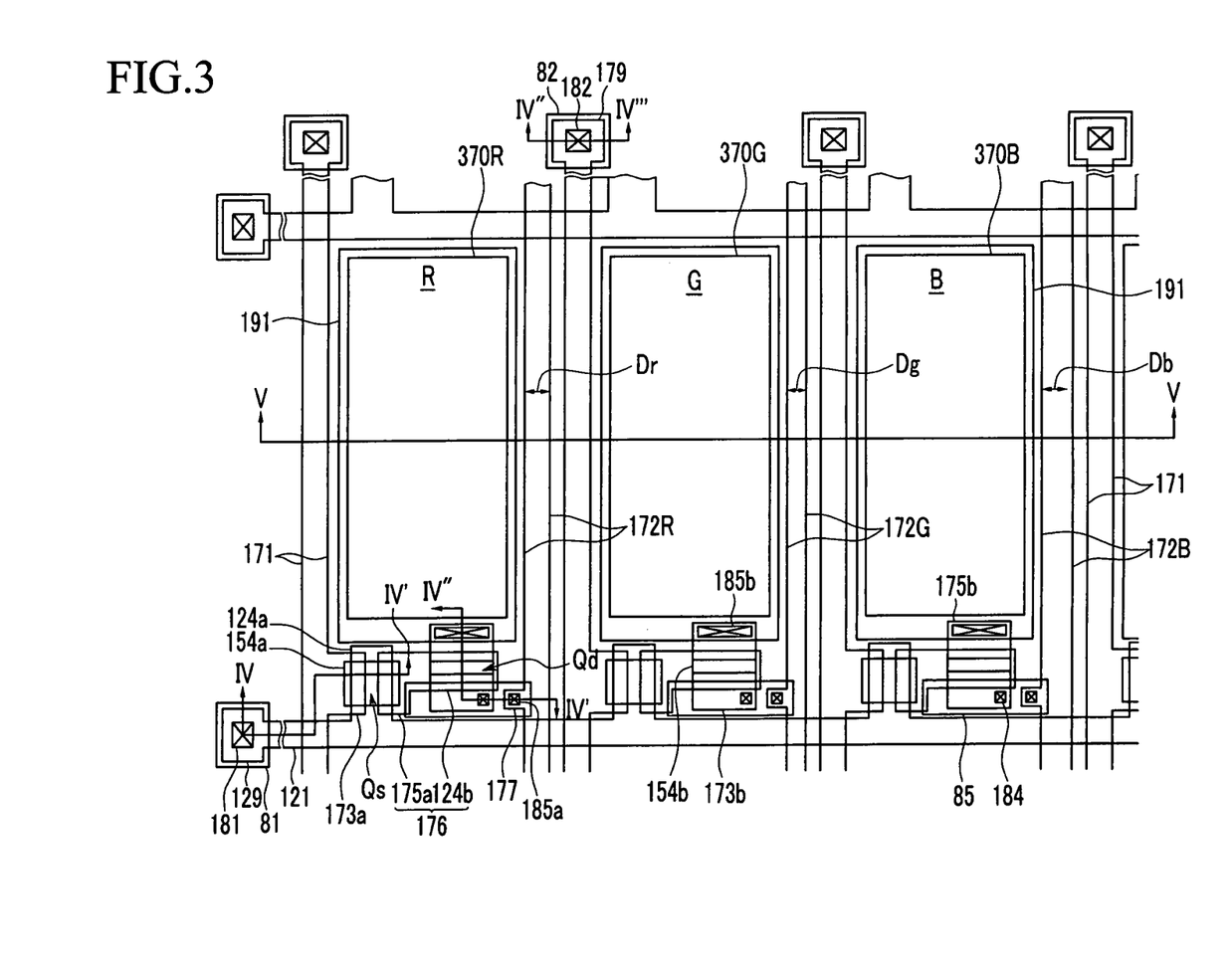
FIG. 3 illustrates a layout view of three neighboring pixels in the OLED display of FIG. 2.
Figure 4:
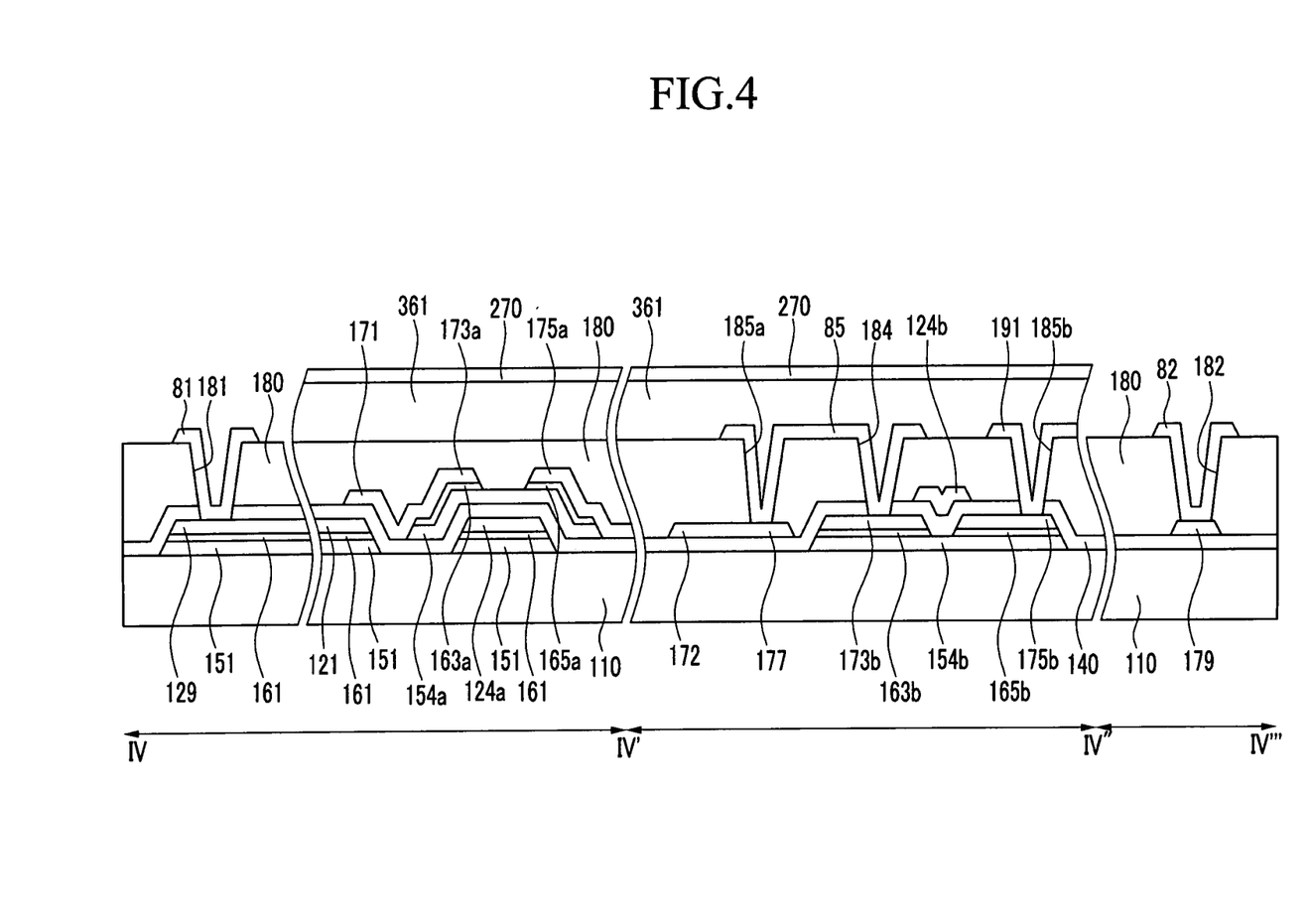
FIG. 4 illustrates a cross-sectional view of the OLED display of FIG. 3, taken along the line IV-IV'-IV''-IV'''.
Figure 5:
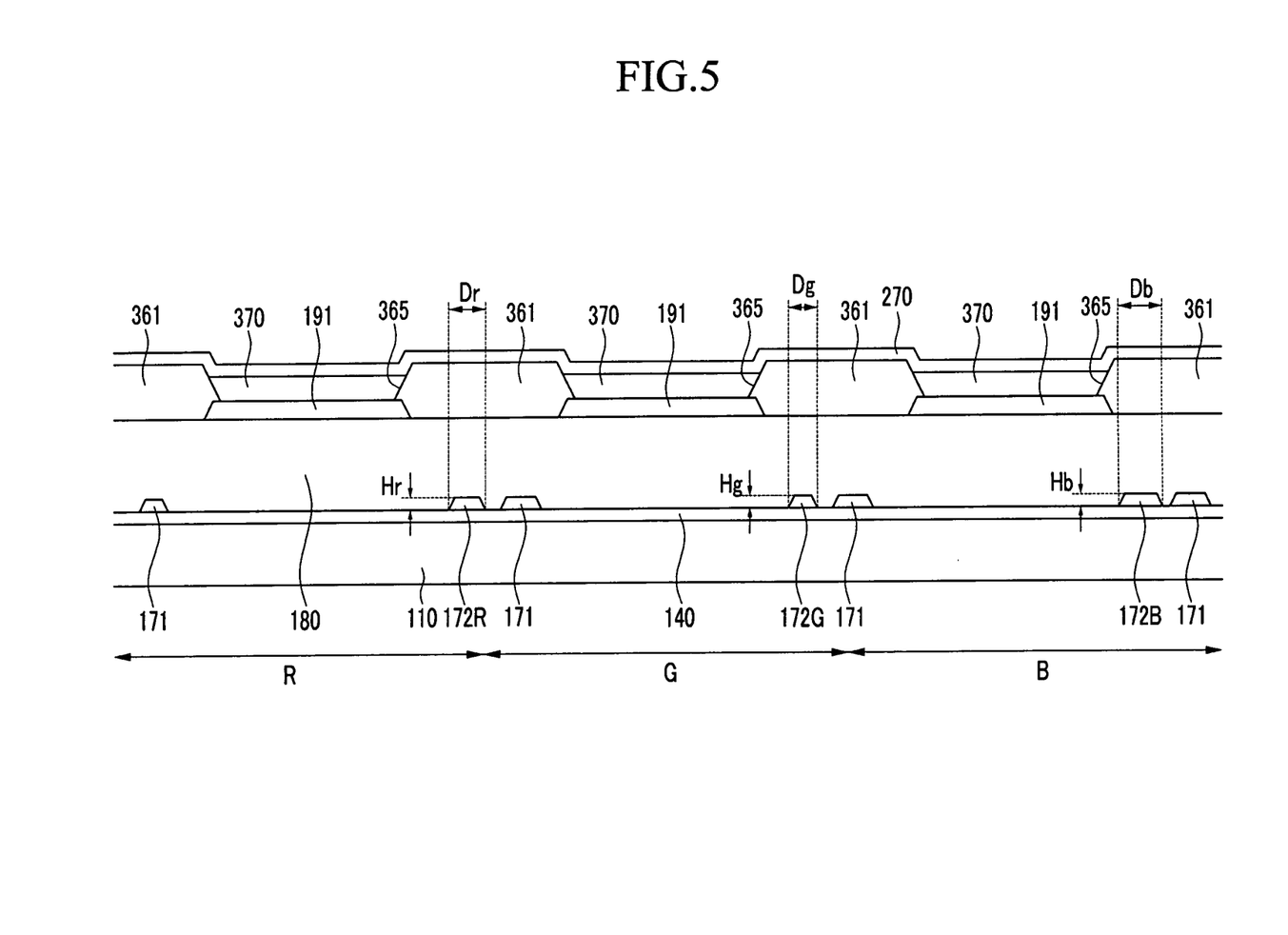
FIG. 5 illustrates a cross-sectional view of the OLED display of FIG. 3, taken along the line V-V.

FIG. 2 is a schematic diagram of arrangement of a plurality of pixels in the OLED display according to the exemplary embodiment. FIG. 3 is a layout view of three neighboring pixels in the OLED display of FIG. 2. FIG. 4 is a cross-sectional view of the OLED display of FIG. 3, taken along the line IV-IV'-IV''-IV'''. FIG. 5 is a cross-sectional view of the OLED display of FIG. 3, taken along the line V-V.

Referring to FIG. 2, a first pixel, a second pixel, and a third pixel are alternately arranged in each row of the OLED display according to the exemplary embodiment. The first pixel may be a red pixel R representing a red color, the second pixel may be a green pixel G representing a green color, and the third pixel may be a blue pixel B representing a blue color. Three pixels including the red pixel R, the green pixel G, and the blue pixel B form one group and are iteratively arranged along the row.

In addition, pixels arranged in the same column represent the same color. The red pixels R are arranged in a first column, the green pixels G are arranged in a second column, the blue pixels B are arranged in a third column, and so forth.

A detailed structure of the OLED display of FIG. 2 will now be described with reference to FIG. 3 to FIG. 5.

FIG. 3 illustrates one pixel group including the red pixel R, the green pixel G, and the blue pixel B arranged in one row in the OLED display of FIG. 2. Excluding driving power lines 172, gate lines 121, data lines 171, switching thin film transistors Qs and driving thin film transistors Qd of the three pixels have the same structure. Thus, like reference numerals designate like constituent elements.

A plurality of driving semiconductors 154b and a plurality of stripe semiconductor members 151 are formed on a substrate 110.

The driving semiconductors 154b are island-shaped, and the stripe semiconductor members 151 substantially extend in a horizontal direction. The driving semiconductor 154b and the stripe semiconductor member 151 may be formed of a crystalline semiconductor material or an amorphous semiconductor material.

A plurality of gate lines 121, a plurality of driving input electrodes 173b, and a plurality of driving output electrodes 175b are formed on the driving semiconductor 154b and the stripe semiconductor member 151.

The gate lines 121 transmit a gate signal and substantially extend in a a horizontal direction. Each gate line 121 includes a switching control electrode 124a extending upward and an end portion 129 having a wide area for contact with another layer or an external driving circuit. The gate line 121 and the stripe semiconductor member 151 substantially have the same plane shape.

The driving input electrode 173b and the driving output electrode 175b are island-shaped, and separated from the gate line 121. The driving input electrode 173b and the driving output electrode 175b face each other on the driving semiconductor 154b.

A plurality of pairs of ohmic contact members 163b and 165b are formed between the driving semiconductor 154b and the driving input electrode 173b and between the driving semiconductor 154b and the driving output electrode 175b. In addition, a stripe semiconductor member 161 doped with impurity is formed between the gate line 121 and the stripe semiconductor member 151.

The ohmic contact members 163b and 165b and the stripe semiconductor member 161 doped with impurity can be formed with fine crystal silicon in which n-type impurities such as phosphorus (P) are doped at a high concentration, or a crystal semiconductor material or an amorphous semiconductor material in which impurities such as polycrystalline silicon.

A gate insulating layer 140 is formed on the gate line 121, the driving input electrode 173b, and the driving output electrode 175b.

A plurality of switching semiconductors 154a formed with hydrogenated amorphous silicon are formed on the gate insulating layer 140. The switching semiconductors 154a are island-shaped and overlap the switching control electrode 124a.

A plurality of data lines 171, a plurality of driving power lines 172, and a plurality of electrode members 176A are formed on the switching semiconductor 154a and the gate insulating layer 140.

The data lines 171 transmit a data signal, and extend in a vertical direction such that they cross the gate lines 121. Each data line 171 includes a plurality of switching input electrodes 173a extending toward the switching control electrode 124a and an end portion 179 having a wide area for contact with another layer or an external driving circuit.

The driving power lines 172 transmit a driving voltage, and extend along a vertical direction such that they cross the gate line 121 and almost parallel with the data lines 171. Each driving power line 172 includes a protruding portion 177. The driving power line 172 includes a first driving power line connected to the red pixel R, a second driving power line connected to the green pixel G, and a third driving power line connected to the blue pixel B. The first driving power line is a red driving power line 172R transmitting a driving voltage to the red pixel R, the second driving power line is a green driving power line 172G transmitting a driving voltage to the green voltage G, and the third driving power line is a blue driving power line 172B transmitting a driving voltage to the blue pixel B.

The electrode member 176 is island-shaped, and separated from the data line 171 and the driving power line 172. The electrode member 176 includes a portion (hereinafter, referred to as a switching output electrode) 175a facing the switching input electrode 173a and a portion (hereinafter, referred to as a driving control electrode) overlapping the driving semiconductor 154b. The switching input electrode 173a and the switching output electrode 175a face each other on the switching semiconductor 154a.

A plurality of pairs of ohmic contact members 163a and 165a are formed between the switching semiconductor 154a and the switching input electrode 173a and between the switching semiconductor 154a and the switching output electrode 175a.

A protective layer 180 is formed on the data line 171, the driving power line 172, and the electrode member 176.

A plurality of contact holes 185a and 182 that expose the protruding portion 177 of the driving power line 172 and the end portion 179 of the data line 171 are formed in the protective layer 180. A plurality of contact holes 181, 184, and 185b that expose the end portion 129 of the gate line 121, the driving input electrode 173b, and the driving output electrode 175b are formed in the protective layer 180 and the gate insulating layer 140.

A plurality of pixel electrodes 191, a plurality of connection members 85, and a plurality of contact auxiliary members 81 and 82 are formed on the protective layer 180.

The pixel electrode 191 is connected with the driving output electrode 175b through the contact hole 185b.

The connection member 85 is connected with the protruding portion 172 of the driving power line 172 and the driving input electrode 173b through the contact holes 184 and 185a, and forms the storage capacitor Cst by partially overlapping the driving control electrode 124b.

The contact auxiliary members 81 and 82 are respectively connected with the end portion 129 of the gate line 121 and the end portion 179 of the data line 171 through the contact holes 181 and 182.

The pixel electrode 191, the connection member 85, and the contact auxiliary members 81 and 82 may be formed with a transparent conductor, e.g., ITO or IZO.

An insulating bank 361 is formed on the pixel electrode 191, the connection member 85, and the contact auxiliary members 81 and 82. The bank 361 defines an opening 365 by surrounding the periphery of the edge of the pixel electrode 191.

An organic light emitting member 370 is formed on the bank 361 and the pixel electrode 191.

The organic light emitting member 370 may include an auxiliary layer (not shown) for enhancing light emission efficiency of the light emission layer, in addition to the organic emission layer that emits light. The auxiliary layer may be one or more selected from an electron transport layer (ETL), a hole transport layer (HTL), an electron injection layer (EIL), and a hole injection layer (HIL).

The organic light emitting member 370 includes a red organic light emitting member 370R emitting red light, a green organic light emitting member 370G emitting green light, and a blue organic light emitting member 370B emitting blue light.

A common electrode 270 is formed on the organic light emitting member 370. The common electrode 270 may be formed with a metal having high transmittance. The common electrode 270 may be formed over the entire surface of the substrate, and allows a current to flow to the organic light emitting member 370 as a pair with the pixel electrode 191.

The common electrode 270 emits light emitted from the organic light emitting member 370 toward a bottom side direction by reflecting the light. As described, the OLED display according to the present exemplary embodiment is a bottom emission type, but it is not limited thereto.

The pixel electrode 191, the organic light emitting member 370, and the common electrode 270 form the organic light emitting diode (OLED) LD. The pixel electrode 191 may be an anode and the common electrode 270 may be a cathode, or the pixel electrode 191 may be a cathode and the common electrode 270 may be an anode.

A cross-section Sr of the driving red driving power line 172R transmitting the driving voltage to the red pixel R, a cross-section Sg of the green driving power line 172G transmitting the driving voltage to the green pixel G, and a cross-section Sb of the blue driving power line 172B transmitting the driving voltage to the blue pixel B may be determined in proportional to a consumed current Ir of the red pixel R, a consumed current Ig of the green pixel G, and a consumed current Ib of the blue pixel B.

The cross-sections Sr, Sg, and Sb of the respective driving power lines 172R, 172G, and 172B are defined by multiplication of line widths and thicknesses of the respective driving power lines 172R, 172G, and 172B.

Thus, when a thickness Hr of the red driving power line 172R a thickness Hg of the green driving power line 172G, and a thickness Hb of the blue driving power line 172B are equivalent to each other, a line width Dr of the red driving power line 172R, a line width Dg of the green driving power line 172G, and a line width Db of the blue driving power line 172B may be determined in proportional to the consumed current Ir of the red pixel R, the consumed current Ig of the green pixel G, and the consumed current Ib of the blue pixel B.

In further detail, the thickness Hr of the red driving power line 172R, the thickness Hg of the green driving power line 172G, and the thickness Hb of the blue driving power line 172B may have a relationship as given in Equation 1.

$Dr<Db$ $Dg<Db$ [Equation 1]

Thus, a resistance Rr of the red driving power line 172R, a resistance Rg of the green driving power line 172G, and a resistance Rb of the blue driving power line 172B may have a relationship as given in Equation 2.

$Rb<Rr$ $Rb<Rg$ (Equation 2)

In further detail, the resistance Rr of the red driving power line 172R, the resistance Rg of the green driving power line 172G, and the resistance Rb of the blue driving power line 172B may have a relationship as given in Equation 3.

$Rr:Rg:Rb=1/1.3$ to $1.2:1:1/2.3$ to $1/3$ (Equation 3)

In this case, a voltage drop value ΔVr of the red driving power line 172R, a voltage drop value ΔVg of the green driving power line 172G, and a voltage drop value ΔVb of the blue driving power line 172B are equivalent to each other. Here, the voltage drop value ΔVr, the voltage drop value ΔVg, and the voltage drop value ΔVb are multiplication of the consumed current and the resistance.

For example, when the ratio of the consumed current Ir of the red organic light emitting member 380R of the red pixel R, the consumed current Ig of the green organic light emitting member 370G of the green pixel G, and the consumed current Ib of the blue organic light emitting member 370B of the blue pixel B is Ir:Ig:Ib=2:1:3, the ratio of the resistance Rr of the red driving power line 172R, the resistance Rg of the green driving power line 172G, and resistance Rb of the blue driving power line 172B is Rr:Rg:Rb=1/2:1:1/3 such that the voltage drop value ΔVr of the red driving power line 172R, the voltage drop value ΔVg of the green driving power line 172G, and the voltage drop value ΔVb of the blue driving power line 172B can be equivalent to each other.

As described, the voltage drop value ΔVr of the red driving power line 172R, the voltage drop value ΔVg of the green driving power line 172G, and the voltage drop value ΔVb of the blue driving power line 172B become equivalent to each other by controlling the cross-section Sr of the red driving power line 172R, the cross-section Sg of the green driving power line 172G, and the cross-section Sb of the blue driving power line 172B. In this case, when the thickness Hr of the red driving power line 172R, the thickness Hg of the green driving power line 172G, and the thickness Hb of the blue driving power line 172B become equivalent to each other by controlling the line width Dr of the red driving power line 172R, the line width Dg of the green driving power line 172G, and the line width Db of the blue driving power line 172B. Thus, a variation amount of a color coordinate of the red pixel R, a variation amount of a color coordinate of the green pixel G, and a variation amount of a color coordinate of the blue pixel B can be set to be equivalent to each other. Accordingly, variation of a color coordinate of a while color that is the sum of the color coordinates of the red, green, and blue pixels R, G, and B can be prevented.

Hereinafter, a detailed exemplary embodiment will be described with reference to FIG. 6 to FIG. 8.

Figure 6:
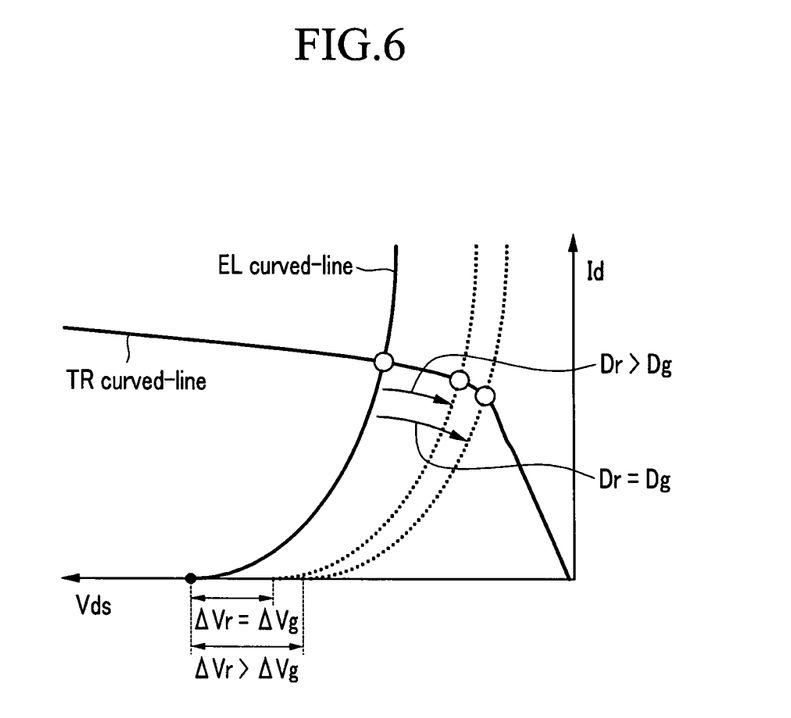
FIG. 6 illustrates a graph of a voltage-current relationship graph (TR curved-line) of a driving transistor and a voltage-current relationship graph (EL curved-line) of an organic light emitting member of the red-color pixel of the OLED display according to the exemplary embodiment.

FIG. 6 is a graph illustrating a voltage-current relationship graph (TR curved-line) of a driving transistor and a voltage-current relationship graph (EL curved-line) of the organic light emitting member of the red pixel of the OLED display according to the exemplary embodiment. FIG. 7 is a graph illustrating a voltage-current relationship graph (TR curved-line) of a driving transistor and a voltage-current relationship graph (EL curved-line) of the organic light emitting member of the green pixel of the OLED display according to the exemplary embodiment. FIG. 8 is a graph illustrating a voltage-current relationship graph (TR curved-line) of a driving transistor and a voltage-current relationship graph (EL curved-line) of the organic light emitting member of the blue pixel of the OLED display according to the exemplary embodiment. Here, Id denotes an output current and Vds denotes a voltage between an input electrode and an output electrode.

In order to realize a white color, all of the red pixel R, the green pixel G, and the blue pixel B should be driven. In this case, due to low efficiency, the blue organic light emitting member 370B of the blue pixel B consumes much more current compared to the red organic light emitting member 370R or the green organic light emitting member 370G.

Light is generated by an energy difference or a voltage difference occurred when excited atoms are in the stable state. For emission of blue light, the blue organic light emitting member 370B requires a greater voltage difference ΔV than the green organic light emitting member 370G or the red organic light emitting member 370R, and therefore the consumed current Ib of the blue pixel B is higher than the consumed current Ig of the green pixel G and the consumed current Ir of the red pixel R.

For example, when 60 mA is consumed for realizing the white color, the red pixel R consumes 17 mA, the green pixel G consumes 13 mA, and the blue pixel B consumes 30 mA. In this case, the ratio of the consumed current of the red pixel R, the consumed current of the green pixel G, and the consumed current of the blue pixel B is Ir:Ig:Ib=1.3:1:2.3, and this can be represented with Ir:Ig:Ib=1.3Ig:Ig:2.3Ig using the consumed current of the green pixel G.

Thus, the voltage drop value ΔVr of the red driving power line 172R, the voltage drop value ΔVg of the green driving power line 172G, and the voltage drop value ΔVb of the blue driving power line 172B may have a relationship as given in Equation 4.

$$\Delta Vr = Ir^*Rr = 1.3Ig^*Rr$$

$$\Delta Vg = Ig^*Rg$$

$$\Delta Vb = Ib^*Rb = 2.3Ig^*Rb \quad \text{(Equation 4)}$$

In this case, as in a conventional case, when the line width Dr of the red driving power line 172R, the line width Dg of the green driving power line 172G, and the line width Db of the blue driving power line 172B are equivalent to each other, a voltage drop ΔVg of the green driving power line 172G at a given position P is ΔVg, a voltage drop ΔVr of the red driving power line 172R at the given position P is 1.3ΔVg, and a voltage drop ΔVb of the blue driving power line 17B at the give location is 2.3ΔVg.

As described, when the line width Dr of the red driving power line 172R, the line width Dg of the green driving power line 172G, and the line width Db of the blue driving power line 172B are equivalent to each other, the red driving power line 172R, the green driving power line 172G, and the blue driving power line 172B have different voltage drop values at a center portion of the driving power line even though the same driving voltage is supplied to an initial supply of the red driving power line 172R, the green driving power line 172G, and the blue driving power line 172B.

Figure 7:
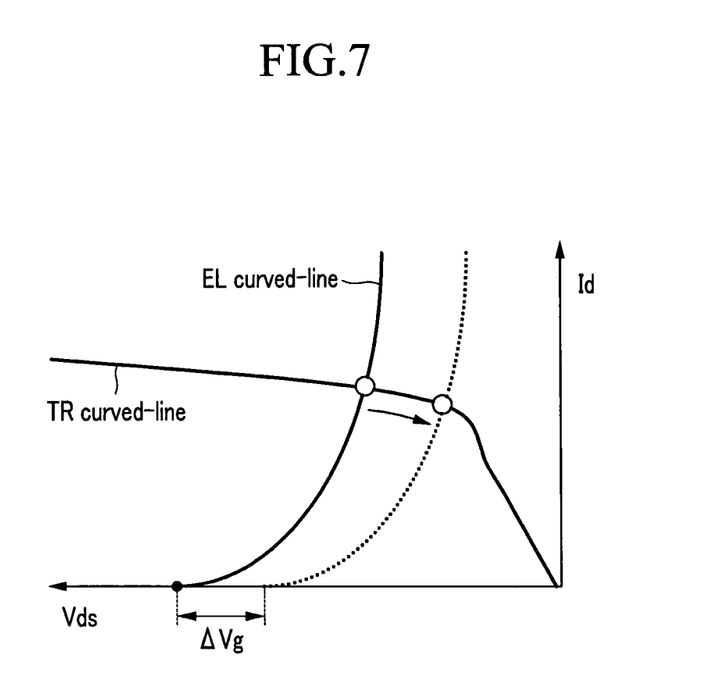
FIG. 7 illustrates a graph of a voltage-current relationship graph (TR curved-line) of a driving transistor and a voltage-current relationship graph (EL curved-line) of the organic light emitting member of the green pixel of the OLED display according to the exemplary embodiment.
Figure 8:
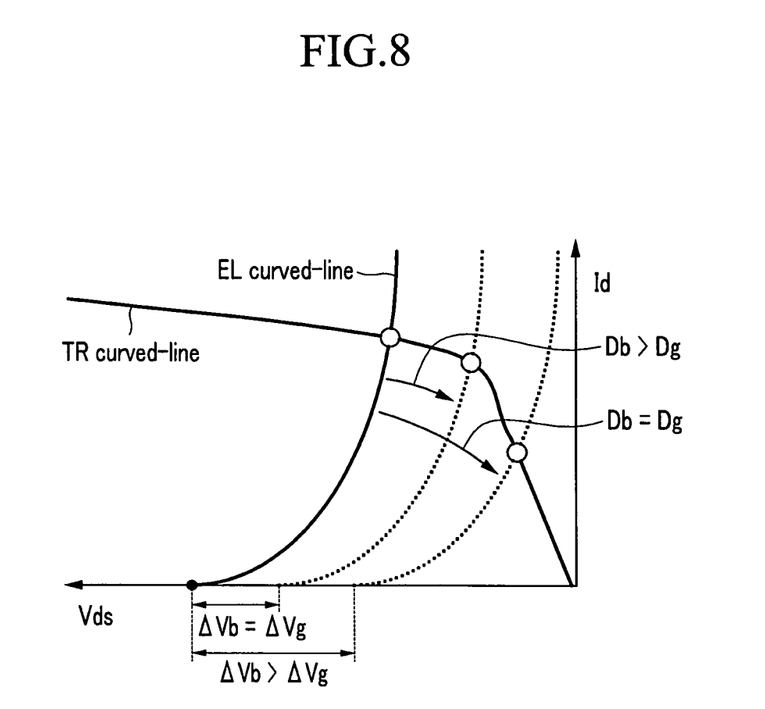
FIG. 8 illustrates a graph of a voltage-current relationship graph (TR curved-line) of a driving transistor and a voltage-current relationship graph (EL curved-line) of the organic light emitting member of the blue pixel of the OLED display according to the exemplary embodiment.

Particularly, as shown in FIG. 8, since the blue driving power line 172B has a large voltage drop ΔVb, luminance of the blue pixel B is decreased and a color coordinate of the blue pixel B is greatly changed. As shown in FIG. 6, since the voltage drop ΔVr of the red driving power line 172R is lower than that of the blue driving power line 172B, luminance of the red pixel R is decreased less than that of the blue pixel B and the color coordinate of the red pixel R is changed less than that of the blue pixel B. In addition, as shown in FIG. 7, since the voltage drop ΔVg of the green driving power line 172G is lower than that of the red driving power line 172R, luminance of the green pixel G is decreased less than that of the red pixel R and the coordinate of the green pixel G is changed less than that of the red pixel R. Therefore, when realizing the white color, the red pixel R, the green pixel G, and the blue pixel B are different from each other in the variation amount of the color coordinate, a color coordinate of the white color that is the sum of the color coordinates of the green and blue pixels G and B may be changed.

However, in the OLED display according to the exemplary embodiment, the voltage drop value ΔVr of the red driving power line 172R, the voltage drop value ΔVg of the green driving power line 172G, and the voltage drop value ΔVb of the blue driving power line 172B may be made equivalent to each other by controlling the line width Dr of the red driving power line 172R, the line width Dg of the green driving power line 172G, and the line width Db of the blue driving power line 172B.

For example, line width Dr of the red driving power line 172R, the line width Dg of the green driving power line 172G, and the line width Db of the blue driving power line 172B are controlled in order to make Dr=1.3Dg and Db=2.3Dg. Thus, Rr=Rg/1.3 and Rb=Rg/2.3.

In this case, the voltage drop ΔVr of the red driving power line 172R at the given position P, a voltage drop ΔVg of the green driving power line 172G at the given position P, and a voltage drop ΔVb of the blue driving power line 172B have a relationship as given in Equation 5.

$$\Delta Vr = Ir^*Rr = 1.3Ig^*Rr = Ig^*Rg$$

$$\Delta Vg = Ig^*Rg$$

$$\Delta Vb = Ib^*Rb = 2.3Ig^*Rb = Ig^*Rg \quad \text{(Equation 5)}$$

Thus, ΔVr=ΔVg=ΔVb, and the voltage drops ΔVr, ΔVg, and ΔVb of the driving voltages applied to the red pixel R, the green pixel G, and the blue pixel B at the same low become equivalent to each other.

In this case, as shown in FIG. 6 and FIG. 7, when the line width Dr of the red driving power line 172R is equivalent to the line width Dg of the green driving power line 172G, the voltage drop ΔVr is greater than the voltage drop ΔVg of the green driving power line 172G. However, when the line width Dr of the red driving power line 172R is greater than the line width Dg of the green driving power line 172G, the voltage drop ΔVr becomes equivalent to the voltage drop ΔVg of the green driving power line 172G.

Further, as shown in FIG. 7 and FIG. 8, when the line width Db of the blue driving power line 172B is the same as the line width Dg of the blue driving power line 172G, the voltage drop ΔVb of the blue driving power line 172B becomes greater than the voltage drop ΔVg of the green driving power line 172G. However, when the line width Db of the blue driving power line 172B is greater than the line width Dg of the green driving power line 172G, the voltage drop ΔVb of the blue driving power line 172B becomes equivalent to the voltage drop ΔVg of the green driving power line 172G. In this case, the line width Db of the blue driving power line 172B should be greater than the line width Dr of the red driving power line 172R.

By way of summation and review, according to embodiment described above, the fluctuation amount of a color coordinate of a red pixel, the fluctuation amount of a color coordinate of a green pixel, and the fluctuation amount of a color coordinate of a blue pixel may be controlled to be equivalent to each other by setting a line width of a red driving power line, a line width of a green driving power line, and a line width of a blue driving power line to be different from each other to thereby prevent fluctuation of a coordinate of a white color.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display having a first pixel, a second pixel, and a third pixel arranged in a matrix format, the OLED display comprising:
   a substrate;
   gate lines on the substrate;
   data lines crossing the gate lines and insulated from the gate lines;
   a plurality of driving power lines on the substrate, the plurality of driving power lines including a first driving power line transmitting a driving voltage to the first pixel, a second driving power line transmitting a driving voltage to the second pixel, and a third driving power line transmitting a driving voltage to the third pixel, the first pixel being a green pixel, the second pixel being a red pixel, and the third pixel being a blue pixel;

a switching thin film transistor connected with the gate lines and the data lines;

a driving transistor connected with the switching thin film transistor and the driving power lines;

a first electrode connected with the driving transistor;

an organic light emitting member formed on the first electrode; and a second electrode formed on the organic light emitting member, wherein a cross-sectional area of the first driving power line, a cross-sectional area of the second driving power line, and a cross-sectional area of the third driving power line are respectively proportional to a consumed current of the first pixel, a consumed current of the second pixel, and a consumed current of the third pixel, wherein the third driving power line has a width greater than a width of the second driving power line and the second driving power line has a width greater than a width of the first driving power line, and wherein the first, second, and third driving power lines have substantially a same thickness.

2. The OLED display as claimed in claim 1, wherein:

the cross-sectional area of the driving power line is a product of a line width and a thickness of the driving power line, and the line width of the first driving power line, the line width of the second driving power line, and the line width of the third driving power line are respectively proportional to the a consumed current of the first pixel, a consumed current of the second pixel, and a consumed current of the third pixel.

3. The OLED display as claimed in claim 1, wherein resistance of the third driving power line is lower than resistance of the first driving power line and resistance of the second driving power line.

4. The OLED display as claimed in claim 3, wherein, when resistance of the first driving power line is Rr, resistance of the second driving power line is Rg, and resistance of the third driving power line is Rb, Rr:Rg:Rb=1/1.3 to 1/2:1:1/2.3 to 1/3 is satisfied.

5. The OLED display as claimed in claim 1, wherein the first driving power line, the second driving power line, and the third driving power line respectively have substantially a same voltage drop value.

6. The OLED display as claimed in claim 5, wherein voltage drop values of driving voltages respectively applied to first, second, and third pixels in a same row are substantially equivalent to each other.

7. A display device, comprising:

a plurality of pixels; and a plurality of power supply lines coupled to respective ones of the pixels, wherein a first power supply line coupled to a blue pixel has a width greater than a width of a second power supply line coupled to a red pixel and the second power supply line has a width greater than a width of a third power supply line coupled to a green pixel, wherein each pixel includes a first electrode and a second electrode, and wherein the power supply lines are different from the first electrode and the second electrode of respective ones of the pixels.

8. The display device as claimed in claim 7, wherein the first, second, and third driving power lines have substantially a same thickness.

9. The display device as claimed in claim 7, wherein each of the pixels includes an organic light emitting diode.

10. The display device as claimed in claim 7, wherein voltage drops of the first, second, and third power lines are substantially equal.

11. The display device as claimed in claim 10, wherein:

a ratio of resistances of the first, second, and third power supply lines is substantially 1/3 to 1/1.3 to 1.2:1:1/2.3.

12. The display device as claimed in claim 10, wherein:

a ratio of current consumed by the pixels respectively coupled to the first, second, and third power supply lines Ib:Ir:Ig=3:2:1.

* * * * *